United States Patent [19]

Babitzka et al.

[11] Patent Number: 4,463,727

[45] Date of Patent: Aug. 7, 1984

[54] DIESEL ENGINE FUEL INJECTION SYSTEM

[75] Inventors: Rudolf Babitzka, Kirchberg; Walter Beck; Walter Schlagmüller, both of Schwieberdingen, all of Fed. Rep. of Germany

[73] Assignee: Robert Bosch GmbH, Stuttgart, Fed. Rep. of Germany

[21] Appl. No.: 415,458

[22] Filed: Sep. 1, 1982

[30] Foreign Application Priority Data

Sep. 8, 1981 [DE] Fed. Rep. of Germany ....... 3135494

[51] Int. Cl.³ .......................................... F02M 39/00
[52] U.S. Cl. .................................... 123/458; 123/459; 123/498
[58] Field of Search ............. 123/446, 458, 459, 500, 123/501, 502, 498

[56] References Cited

U.S. PATENT DOCUMENTS

| 3,589,345 | 6/1971 | Benson | 123/498 |
| 3,880,131 | 4/1975 | Twaddell et al. | 123/500 |
| 4,180,022 | 12/1979 | Khair et al. | 123/498 |
| 4,351,283 | 9/1982 | Ament | 123/458 |

FOREIGN PATENT DOCUMENTS 2074658A 11/1981 United Kingdom ............... 123/446

Primary Examiner—Magdalen Y. C. Moy
Attorney, Agent, or Firm—Frishauf, Holtz, Goodman & Woodward

[57] ABSTRACT

A Diesel engine distributor-type injection pump has a vane pump (3) providing fuel under pressure to an injection pump system formed by two pistons (17) pressed towards each other by a cam track (26) to provide fuel under injection pressure to fuel injection plug connectors (28, 29) when the radial position of a duct (27) in the bore of the rotating shaft (2) matches a connecting duct (28) of a respective injection outlet. To provide for precise timing of fuel being injected, pressurized fuel is drained under control of a slider valve (FIG. 1: 38, 39; FIG. 2: 72, 74) connected through a communicating duct (32, 42, 71) to the slider valve. The slider valve is operated by a piezoelectric positioning element (FIG. 1: 61; FIG. 2: 76) which moves the spool (74, 39) of the slider valve; in one embodiment (FIG. 1), the piezoelectric element operates a piston (53) having a substantially larger diameter than the end faces of the spool (39) to provide for excursion amplification; in another embodiment (FIGS. 2, 4–8), the piezoelectric elements are bending elements and thus provide for larger excursion.

30 Claims, 8 Drawing Figures

DIESEL ENGINE FUEL INJECTION SYSTEM

Reference to related application, assigned to the assignee of the present invention: U.S. Ser. No. 416,346, filed Sept. 9, 1982, BABITZKA et al, entitled "FUEL INJECTION VALVE SYSTEM".

The present invention relates to a fuel injection valve system for use with an internal combustion engine, in which fuel is to be injected at a predetermined time instant in relation to an operating parameter of the engine, and more specifically to a fuel injection system for Diesel engines, and especially of the automotive type.

BACKGROUND

Diesel engine fuel injection systems have been constructed in combination with a distributor unit to distribute the injected fuel to the respective cylinders; such combined Diesel engine distributor-injection pumps are described in the "Automotive Handbook", issued by the assignee of the present invention, in the chapter relating to Diesel engine injection pumps. Such pumps control the quantity of injected fuel as well as the timing of the injection. They include a speed-sensitive element, such as a centrifugal controller, which changes the injection instant with respect to the top-dead-center (TDC) position of the piston. Mechanical or mechanical/hydraulic adjustment arrangements are used. Play and backlash must be rigorously avoided in order to reduce erroneous injection timing and maladjustment. Thus, numerous precise fittings and matching engagement surfaces have to be carefully made; numerous accurately matched and fitted engagement surfaces between the various elements of the injection pumps are required. This causes expense and the overall transmission mechanism then likewise becomes expensive. Additional elements are required to permit correction under warm-up conditions.

THE INVENTION

It is an object to improve an internal combustion engine fuel injection system, and more particularly a Diesel engine fuel injection system, especially of the injection-distributor pump combination type, which has a lesser number of elements subject to wear, and which permits more accurate control of initiation of injection as well as the duration of injection, while decreasing weight and expense in manufacture.

Briefly, a control element is provided which includes a piezoelectrically controlled control slider.

In accordance with a feature of the invention, the control slider controls application of hydraulic pressure to respectively opposite sides of a spool valve, so that the control slider operates in the form of a pilot valve; the piezoelectrically controlled control slider has only a small travel; the surface area of the control slider, however, can be made substantially larger than the active surface of the spool of the main spool valve to obtain, thereby, travel path amplification.

The system has the advantage that it has only few elements subject to wear, is of lighter weight than previous apparatus, and permits accurate control of the initiation of injection as well as the injection duration. Since the controlled element is a control slider which operates under control of a piezoelectric element, electrical control of the movement of the control slider is readily possible, and the electrical control, then, can be so arranged that it can reflect the output of a vehicle-operating computer which can process signals considering a plurality of parameters arising in the operation of the engine, such as speed, loading, exhaust gas composition and recirculation, temperature, and other factors, to properly control the quantity of fuel being injected, as well as the timing of the injection.

The piezoelectric control element can be constructed in various ways. In accordance with a feature of the invention, it is a built as a piezohydraulic control block; it can also be constructed in the form of a control block built up as an assembly of a plurality of piezoelectrically controlled bending or deflection positioning elements in order to provide the necessary switching forces to control the course of the fuel injection, and to also directly control the valves which, in turn, control the hydraulic path of fuel.

DRAWINGS

Figure 1:
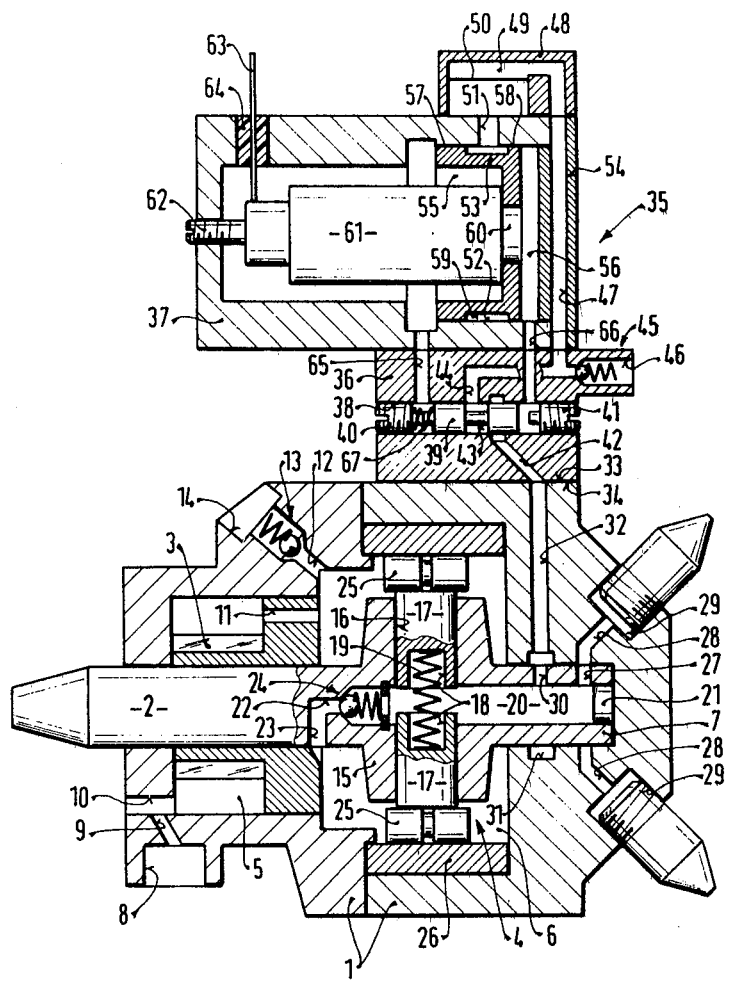
FIG. 1 is a longitudinal view through a piezohydraulic control block associated with a distributor-type fuel injection pump.

A two-part housing 1 has a shaft 2 journalled therein. The housing 1 is formed with a chamber 5 within which a centrifugal pump 3 is located, coupled to the shaft 2. The housing 1 is formed with an additional chamber 6 within which a double piston pump 4 is located. The shaft portion 7 of the shaft 2 beyond the double-portion piston pump is formed as a distributor. The housing 1 has a connection 8 for a fuel supply line. Ducts 9 and 10 lead from the inlet 8 to the chamber 5. Duct 10 is normally closed and permits drainage of fuel, for example for cleaning. A duct 11 communicates the pressure side of the chamber 5 with the chamber 6. A duct 12 leads from chamber 6 via a pressure limiting valve 13 to a connection 14 for a fuel return line. A flange 15 is formed on the shaft 2, positioned in the chamber 6, the flange 15 having a cylindrical bore 16 extending through a diameter thereof. Two pistons 17 are slidably located within the cylindrical bore 16. The pistons 17 of this pair are formed with bores 18 in the walls facing each other. A helical spring 19 is located in the bores of the piston to tend to force the pistons outwardly. The helical spring 19 is under compression.

The shaft 2, in the portion 7, is formed with a longitudinal bore 20 which is closed off at the right end (with respect to FIG. 1).

The bore 20 extends throughout the shaft 2 towards the left side thereof. At the inner end the bore 20 is conically constricted, terminating in a smaller axial bore 22. The smaller axial bore 22 is connected over a radial bore 23 with the chamber 6. The ball of a check valve 24 is located in the transition cone between the longitudinal bore 20 and the axial bore 22. The ball is spring-loaded, the spring being held in position by a snap ring, snapped into a groove formed in the bore 20.

Each one of the pistons of the piston pair 17 is externally supported by a respective roller of a pair of rollers 25. The rollers 25 are pressed outwardly against an inner cam ring 26. Shaft 2 is formed with a radial bore 27 just inwardly of the end plug 21. The housing 1 is formed with a plurality of ducts 28 located in star-shape around the circumference of the shaft 2, for example with four ducts 28 for a four-cylinder engine. When the radial duct 27 is opposite a duct 28, fuel can flow to connecting plugs 29 which connect to fuel injection valves. As the shaft rotates, pressurized fuel is thus also distributed to the respective injection valves.

Shaft 2 is formed with a further radial bore 30 which leads to a ring groove 31 formed in the housing 1 and receiving the end portion 7 of the shaft 2. A duct 32 leads from the ring groove 31 to a connecting surface 33 on housing 1.

A piezohydraulic control block 35, formed with a matching connecting surface 34, is clamped to the distributor pump 1.

In accordance with a feature of the invention, the piezohydraulic control block has a spool slider housing 36 and a control or driver valve housing 37 which retains respective spool valve and control valve elements.

The housing 36 is formed with a bore 38 within which a control spool 39 of a spool valve is positioned. The length of spool 39 is so dimensioned that it can move between right and left ends of the bore 38; the bore 38 is closed off towards the outside with positionable threaded, tightly fitting bolts 40, 41, so that the slider path of the valve spool 39 can be controlled. The respective matching surfaces 33, 34 of the distributor valve housing 1 and of the valve housing 36 provide for matching positioning of a duct 42 formed within the housing 36 with the duct 32 in the housing 1. Duct 42 leads to the cylindrical bore 38. At the intersection of the duct 42 and bore 38, control slider 39 is formed with a cylindrical relief, which is so positioned in the spool that the limiting edge thereof can either open or close the terminal end of the duct 42 with respect to the bore 38. The length of the relief 43 is dimensioned that the inlet opening of the duct 44 is always placed in communication with the space in the bore 38 between the relief 43. Duct 44 is positioned within the housing 36 and terminates in a connection for a return line 46 through a relief valve 45. A duct 47 branches off the fuel return duct 46 in advance of the relief valve 45, the duct 47 passing through the housing 36 and at an end portion of the control unit or control slider housing 35. It is formed in an end cover of the driver housing 37 and terminates in an extension portion 48 of the housing 37. The duct 47 extends to a chamber 49 within the extension portion. One wall of the chamber 49 is formed by a membrane 50; the membrane 50 is not strictly necessary, and may be omitted. One wall of the chamber 49 is formed by the driver housing 37. A duct 51 terminates in this wall which leads to a cylindrical space 52. The cylindrical space 52 is a cylinder which receives a slider piston 53. The space 52 is closed off to the outside by the cover 54 through which the duct 47 extends. The piston or slider 53 subdivides the space 52 into two separate pressure chambers 55 and 56. Throttle gaps 57 and 58 are formed at the margins of the piston or slider 53 and connect the pressure chambers 55, 56, respectively, with the pressure connection communicating with the duct 51. The piston 53 is formed with a cylindrical relief 59 which separates the throttle gaps 57 and 58 from each other. The piston 53 is rigidly connected by a pin 60 with a piezoelectric driver 61. The driver 61 is made of piezoceramic material. Driver 61 is constructed in form of a post and securely connected over a threaded bolt 62 with the driver housing 37. A cable 63 provides for electrical connection of the piezoceramic driver 61, the cable 63 being sealed by a seal 64 towards the outside. The pressure chambers 55, 56 are connected via ducts 65 and 66, partially positioned within the driver housing 37 and partially within the spool valve slider housing 36 to the free end surfaces in the bore 38 adjacent the end faces of the spool 39 of the valve spool.

OPERATION

Let it be assumed that shaft 2 is rotated in order to operate the fuel injection system. The pump 3 which, preferably, is a vane pump, sucks Diesel fuel from connection 8 and provides the Diesel fuel, under pressure, from chamber 5 through duct 11 to chamber 6. Chamber 6, now filled with Diesel fuel, under pressure, will provide the fuel through the double-piston pump 4 and via the check valve 24, upon a suction stroke of the double-piston pump. It is pressed by the double pistons 17 into the longitudinal bore 20 of the fuel distributor portion 7 of the shaft. The fuel, then, passes through the radial bore 27 and one of the ducts 28 to the respective injection nozzle. Additionally, pressurized fuel will pass over the radial bore 30 into the ring chamber 31, and through ducts 32 and 42 to the spool valve in housing 36.

Let it be further assumed that the end of the duct 42 which, for example, is in form of a ring groove in housing 36, is free, that is, if slider spool 39 is moved to the right (FIG. 1); ducts 44 and 47 will have fluid under pressure built up therein, limited, however, by the level of the pressure determined by the relief valve 45 which leads to the fuel return or overflow line via coupling 46. The pressure within duct 47 will be reflected also in chamber 49. If the pressure should be excessive, excess fuel will flow out through connection 46. The pressurized fuel acts on the membrane 50 and, through the membrane, supplies pressure on hydraulic fluid, which may be Diesel fuel, within the driver housing 37. The hydraulic fluid within the driver housing should be free from bubbles, and every free space within the housing 37, and the attachment 48, as well as the ducts 65, 66 on both sides of the control slider are filled with hydraulic fluid. If voltage is applied to the driver 61, it will expand and drive the piston 53 towards the right in FIG. 1. This rapidly and abruptly changes the pressure in the pressure chamber 56 so that the pressure rises in chamber 56, in pulse or other abrupt form. Conversely, the pressure within chamber 55 drops equally. The resulting pressure difference rapidly and abruptly drives the spool 39 towards the left. This closes off the termination of the duct 42 with the bore 38. The double-piston pump, and hence the distributor end 7, will cause an abrupt pressure rise to occur and, in dependence on the angular position of the shaft 2 and hence of the distributor portion 7, the fuel will be forced through the then selected injection valve. Upon disconnection of electrical voltage on the piezoelectric column or transducer 61, the pressure relationships within the pressure chambers 55 and 56 will reverse. The pressure in chamber 55 will rise, and the pressure in chamber 56 drops. This shifts the spool 39 towards the right, from the closed position shown in FIG. 1 towards an open position.

The threaded bolts 40, 41 permit adjustment of the movement, and hence of the position of the spool 39. The position of the bolt 41 at the right end is adjustable by turning the bolt or cap 41 in its threaded end to adjust the "open" position of the valve. The closed position of the valve can be similarly adjusted by turning the end portion 40. A spring 67 is provided to normally move the valve into "open" position. Upon moving to open position, injection is terminated.

Any fluid delivered by the double-piston pump can return via the relief valve 13 back to the fuel supply tank.

The deflection path of the piston 53 operated by the piezoceramic driver 61 is very small. Transfer of this small excursion for the useful excursion of the spool 39 requires that the medium be, effectively, free from gases or any bubbles. The pressure medium is Diesel fuel or Diesel oil. To remove bubbles, the driver housing and the slider housing are filled with gas-free oil; in operation, the pressure chambers 55, 56 are continuously hydraulically stressed by the pressure within chamber 49. The piston 53, which acts on both sides, that is, in push-pull, thus is not endangered by a pressure medium which may contain gas, which pressure medium might be introduced to a piston which operates only from one side of the face thereof.

Operation of the spool piston 39 always causes compression of the pressure medium in the respective pressure chamber. Thus, no bubbles or gas pockets may occur due to gas which might be carried along, or due to dissolved gases which might form bubbles or pockets.

A specific problem arises by the direct conversion of the small piston excursion due to the piezoelectric driver 61. Changes in longitudinal dimension of the driver 61 may occur, without electrical control, due to temperature changes. In the hydraulic transformation here carried out, differential expansion of the volume of the pressure medium and of the driver housing 37 may also play part. These effects are compensated in this manner:

(1) the length of the excursion of the path of the control spool 39 is limited by the mechanical end stops formed by the end bolts 40, 41;

(2) the pressure chambers 55, 56 are connected by the throttle gaps 57, 58;

(3) the pressure chambers 55, 56 are connected by the throttle gaps 57, 58 with the pressure chamber 49;

(4) the hydraulic transformation ratio, due to the differences in cross-sectional area of the pilot piston 53, is arranged to have a specific relationship, namely the ratio of pilot piston 53 cross section to the slider spool 39 cross section is greater than the ratio of slider spool excursion to pilot piston 53 excursion;

(5) the slider 37 is biassed by spring 67 in direction to "open" position, providing for communication of the ducts 30 in the distributor pump 1, ring duct 31, duct 32, duct 42 in housing 36, bore 38, via the relief area 43 to duct 44 and then via the pressure relief valve 45 to the outflow or return or overflow line 46. The spring 67, thus, acts as an "open" or quiescent bias spring;

(6) the longitudinal coefficient of expansion of the piston 53 is selected to be greater than that of the housing 37.

Figure 2:
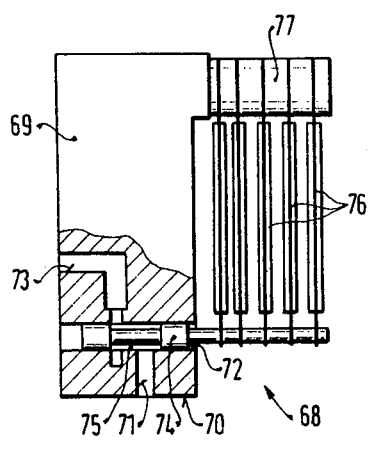
FIG. 2 is a part-sectional side view of a control block using a plurality of piezoelectric bending positioning elements, suitable for use with the distributor pump of FIG. 1, and positionable in lieu of the piezohydraulic control block.
Figure 3:
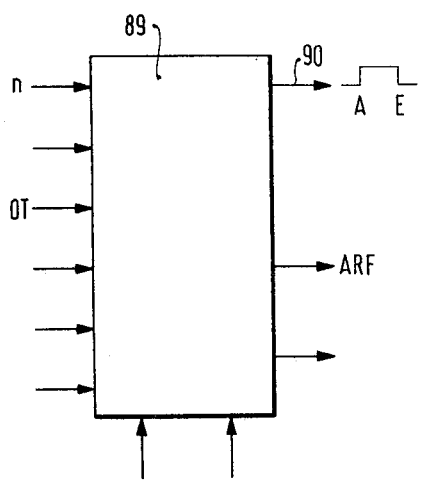
FIG. 3 is a schematic representation of an electronic control unit to provide electrical output signals to the piezoelectric positioning elements in the piezohydraulic or piezoelectric control blocks, including a plurality of inputs and outputs for control pulses arising in the operation of an automotive-type Diesel engine.

Embodiment of FIG. 2: The pump housing 1 and all the components contained therein are similar to those described in connection with FIG. 1. The difference resides in the piezoelectric control. Rather than using the piezohydraulic control block 35 of FIG. 1, a control block 68 is used which has a plurality of piezoelectrically controlled bending or bowing deflection positioning elements. The control block 68 includes a carrier body 69 with a connecting surface 70, matching the surface 33 on housing block 1. A duct 71 which matches duct 32 in housing block 1 leads through a bore 72 to a further duct 73, which is connected to the return or overflow line to return fuel to the fuel tank, or other supply vessel. Bore 72 retains a control spool 74 which carries out the function of the spool slider 39 (FIG. 1). Spool 74 has a cylindrical relief surface 75. One end of the slider spool 74 extends outside of the bore 72 and its free end is connected with a plurality of piezoelectric bending positioning elements 76. The bending positioning elements are fixed at their other end by being secured to a column 77 which, in turn, is securely connected to the carrier body 69.

FIG. 2 illustrates the valve in its "open" position, in which fuel can flow through ducts 71 and 73 to an overflow or return line. No fuel is injected in this position of the control slider 74. This position, preferably, is the quiescent or normal or non-energized position of the bending positioning unit 76, that is, the position before an energizing potential is applied to the piezoelectric bending positioning unit 76. Upon application of a voltage, the bending element 76 will deflect and bend towards the left to drive the slider spool 74 towards the left in FIG. 2, and thus close off duct 71. Consequently, pressure will rise abruptly, in pulse form, within the distributor pump housing, causing fuel to flow through the radial duct 27 to the duct 28 and then, in dependence on the angular position of the shaft 2, to the respective fuel injection valve then being in a position to inject fuel to the cylinder of an internal combustion engine, as described above in connection with the embodiment of FIG. 1.

Figure 4:
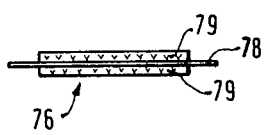
FIG. 4 is a schematic side view of the single piezoelectric positioning element.
Figure 5:
FIG. 5 is a side view of an assembly of elements according to FIG. 4.

FIG. 4 is a cross-sectional view through a single positioning element 76. It includes a metallic strip 78, and ceramic plates 79 applied to both sides or plane surfaces of the strip 78. Preferably, they are applied to the metal strip by sintering. FIG. 5 illustrates a plurality of such strips 76, connected together. Other arrangements may be used for example; more than three such units may be used, and the respective element 76 can be placed serially, as shown in FIG. 5, or a plurality of units placed next to each other, in a parallel connection—in the drawing of FIG. 5 for example next to each other in a plane transverse to the sheet of the drawing.

Figure 6:
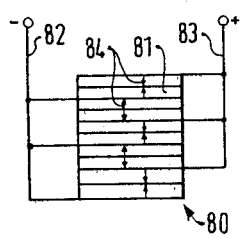
FIG. 6 is a schematic side view illustrating polarization of elements.

A compact stack 80 made of a plurality of ceramic strips 81 without a metallic intermediate layer is shown in FIG. 6. The electrical connections 82, 83 are so selected that the ceramic strips are differently polarized. Arrows 84—see FIG. 6—indicate the direction of polarization. Preferably, layers of non-friction material are introduced between adjacent ceramic strips 81.

Figure 7:
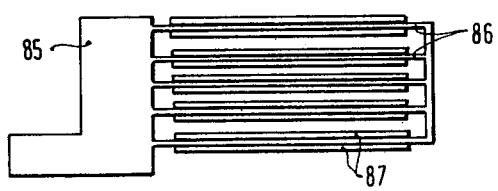
FIG. 7 is a side view of a control block.
Figure 8:
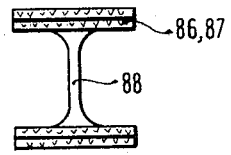
FIG. 8 illustrates a damping arrangement in a cross-sectional end view.

FIG. 7 illustrates a carrier structure 85, made of plastic or metal, with projecting strips 86 on which ceramic strips 87 are positioned. Such a positioning element, preferably, should have damping. To dampen operation of such a positioning element, the structure of FIG. 8 is suitable, in which friction webs 88 are provided, positioned between spaced bending elements 76 or 86, 87, respectively.

The control unit 89, which may be of any standard and well known construction, can be used to provide voltage to the piezoelectric positioning element. Control unit 89 is shown only as a "black box" with inputs and outputs. Input parameters which, for example, should be considered provide signals of engine speed n, load, for example a signal representative of an operator control pedal. The top-dead-center (TDC) position of a reference piston is preferably supplied in form of a signal, for example a pulse occurring at a predetermined count number of input pulses representative of speed n, in which the number of pulses per unit time determines speed. Temperature of lubricating oil, fuel, engine, for example cooling water, ambient air, may also be introduced, as well as signals representative of ambient air pressure, or charge pressure of a turbo-charger, for example. The various signals are processed in the unit 89—in accordance with well known automotive signal processing networks, considering the respective characteristics of the engine upon change in the value of the parameters which are applied to unit 89. The first output 90 provides the signal to turn ON and turn OFF the control voltage to the piezoelectric positioner—either the element 61 of FIG. 1, or any one of the elements of FIGS. 2, 5, 6, 7, respectively. Further outputs can be obtained can be obtained from the control unit, for example controlling exhaust gas recirculation (EGR), emergency disconnection of the engine upon exceeding a certain governing speed, or the like.

Various changes and modifications may be made, and features described in connection with any one of the embodiments may be used with any of the others, within the scope of the inventive concept.

We claim:

1. Piezoelectric hydraulic control unit (35) in combination with a fuel injection pump (2, 22);
   wherein the fuel injection pump (2, 11) has a pump chamber (20) within which fuel under injection pressure is provided;
   and a pressure inlet (42) is connected to be in fluid communication (30, 31, 32) with said injection pressure pump chamber,
   comprising, in accordance with the invention,
   a spool valve having a spool cylinder (38) and a valve spool (39) slidable in the cylinder;
   said valve spool (39) having a section (43) of reduced diameter;
   a drain connection duct means (30, 32, 38, 44, 45, 46) terminating in said spool valve cylinder (38) for selective communication of the pressure inlet (42) with the drain line or blocking of said communication in dependence on the position of the valve spool;
   a hydraulic housing (37) defining a fluid chamber;
   a piston (53) separating said chamber into two pressure chambers (55, 56);
   a piezoelectric driver element (61) coupled to said piston (53) to move the piston in the chamber and change the relative volume of the pressure chambers;
   and wherein the valve spool (39) is positioned in the spool cylinder (38) to subdivide the cylinder and form two cylinder portions, each of which is in communication with a respective one of said pressure chambers (55, 56) to provide for amplified movement of the spool in the spool cylinder upon small excursions of the piston (53), under piezoelectric control by the piezoelectric element (61), and hence control the position of the spool for, selectively, blocking or drainage of fluid therefrom.

2. Combination according to claim 1, wherein said valve spool (39) has a substantially smaller cross-sectional area than the cross-sectional area of said piston (53) coupled to said piezoelectric driver element (61) to provide for amplification of the excursion path of the driver element, and hence of said piston.

3. Combination according to claim 1, wherein the spool cylinder (38) comprises a housing (36);
   a bore (38) formed in the housing;
   and adjustable are provided closing elements (40, 41) closing off said bore and forming adjustable mechanical stop elements for the spool (39).

4. Combination according to claim 1, further including throttling gaps (57, 58) connecting said pressure chambers (55, 56) with each other and with a pressure connection (49, 51) for hydraulic fluid in said chambers (55, 56).

5. Combination according to claim 2, wherein the hydraulic transformation ratio of cross section of the piston (53) to the cross section of the valve spool (39) is greater than the ratio of excursion of the valve spool (39) to the deflection or excursion of the piston (53) as controlled or derived from the piezoelectric driver element coupled thereto.

6. Combination according to claim 1, including a biassing spring (67) tending to move the spool (39) in the direction to provide for fluid communication between the pressure inlet and a drain connection (45, 46).

7. Combination according to claim 1, wherein the hydraulic housing (37) comprises a material having a thermal coefficient of expansion which is less than the thermal coefficient of expansion of the piston (53).

8. Piezoelectric hydraulic control unit (35) in combination with a fuel injection pump (2, 11);
   wherein the fuel injection pump (2, 11) has a pump chamber (20) within which fuel under injection pressure is provided;
   and a pressure inlet (71) is connected to be in fluid communication (30, 31, 32) with said injection pressure pump chamber, comprising
   a housing (69)
   a spool valve having a spool cylinder (72) and a valve spool (74) slidable in the cylinder;
   said valve spool having a section (75) of reduced diameter;
   a drain connection (73);
   duct means (71) terminating in said spool valve cylinder (72) for selective communication of the pressure inlet (71) with the drain line or blocking said communication in dependence on the position of the spool;
   and further comprising a plurality of piezoelectric bending positioning elements (76) coupled to said valve spool (74).

9. Combination according to claim 8, wherein the bending positioning elements comprise a metal strip (78) and two piezoelectric ceramic plates (79) symmetrically applied to said strip.

10. Combination unit according to claim 9, wherein the metal strip is elongated and extends over the ends of the ceramic plates (79) to form terminal connection means therefor.

11. Combination unit according to claim 9, wherein said plurality of piezoelectric elements comprises a unitary stack (80) of stacked ceramic strips (81) of respectively different polarization.

12. Combination according to claim 8, wherein said piezoelectric bending positioning elements comprise a plurality of stacked piezoelectric plates contacting each other free from metallic connecting strips.

13. Combination according to claim 8, wherein said piezoelectric bending positioning elements comprise a plurality of piezoelectric ceramic strips contacting each other are of respectively different polarization, and have metal strips interposed between said piezoelectric strips.

14. Combination according to claim 11, further including low-friction sliding layers interposed between the respective strips.

15. Combination according to claim 12, further including low-friction sliding layers interposed between the respective strips.

16. Combination according to claim 8, wherein said bending positioning elements comprise a plurality of pairs of piezoelectric bending strips;
and spacer elements (88) connecting facing strips of said pairs.

17. Combination according to claim 8, wherein said housing (69) comprises a plastic support, and said bending positioning elements comprise ceramic plates (87).

18. Combination according to claim 8, wherein said housing (69) comprises a metallic support, and said bending positioning elements comprise ceramic plates (87).

19. Combination according to claim 8 including (FIG. 7) a carrier structure (85) and projecting strips (86) extending from said carrier structure, and wherein the piezoelectric bending positioning elements comprise ceramic strips (87) located on said projecting strips (86).

20. Combination according to claim 16, wherein the spacer elements (88) comprise a resiliently deflectable damping material.

21. Combination according to claim 8, wherein the bending elements have a first fixed end secured to said housing (69, 77) and a second free end secured to and controlling operation of said spool (74).

22. Combination according to claim 16, wherein the spacer elements comprise plastic webs rigidly connected to adjacently positioned bending strips to provide for damping by elastic deformation and internal frictional damping upon deformation of the web material.

23. Fuel injection system for an internal combustion engine in which fuel is to be injected at a predetermined time instant in relation to an operating parameter of the engine, particularly for a Diesel engine, having
a fuel injection pump (2, 11, 17, 20, 25, 26);
and means controlling the quantity of injected fuel including
a piezoelectric hydraulic control unit (59) comprising,
a spool valve having a spool cylinder (38) and a valve spool (39) slidable in the cylinder;
said valve spool (39) having a section (43) of reduced diameter;
a drain connection duct means (30, 32, 38, 44, 45, 46) terminating in spool valve cylinder (38) for selective communication of a pressure inlet (42) with the drain line or blocking of said communication in dependence on the position of the valve spool;
a hydraulic housing (37) defining a fluid chamber;
a piston (53) separating said chamber into two pressure chambers (55, 56);
a piezoelectric driver element (61) coupled to said piston (53) to move the piston in the chamber and change the relative volume of the pressure chambers;
and wherein the valve spool (39) is positioned in the spool cylinder (38) to subdivide the cylinder and form two cylinder portions, each of which is in communication with a respective one of said pressure chambers (55, 56) to provide for amplified movement of the spool in the spool cylinder upon small excursions of the piston (53), under piezoelectric control by the piezoelectric element (61), and hence control the position of the spool for, selectively, blocking or drainage of fluid therefrom.

24. System according to claim 23, wherein the fuel injection pump comprises a distributor injection pump having an injection pressure generating portion (15, 16, 17); means (27, 28) for distributing fuel under injection pressure to respective cylinders of th engine; and wherein the fuel quantity control element comprises means for timing occurrence of drainage of fuel at injection pressure to accurately determine the time of build-up of injection pressure and termination of injection pressure of fuel being delivered by the distributor means.

25. System according to claim 24, wherein the distributor means comprises a rotating distributor element (7);
a plurality of distribution passages (28) connectable to respective cylinders of the engine;
a distribution duct (27) in the rotating element, respectively alignable with the distribution passages upon rotation thereof, said distribution passages and distribution ducts forming part of said distributing means;
pressure relief duct means (30, 31, 32; 42, 38, 44, 45, 46; 71, 72, 73) being connected in fluid communication with said distributing means;
and wherein the piezo-electric hydraulic control unit is connected in the pressure relief duct means for controlling drainage of fuel.

26. System according to claim 23, further including an electronic control unit (89) having means to receive a plurality of signals representative of operating or operation parameters of the engine including at least one of: engine speed; loading; air charging temperature; cooling water temperature; lubrication oil temperature; fuel pipe and energy content; ambient air pressure; air charging pressure;
said control unit (89) furnishing control signals determining the injection instant with respect to a piston position in a cylinder of the engine and the termination of injection by providing an output pulse (ON/OFF) to the piezoelectric hydraulic control unit.

27. Fuel injection system for an internal combustion engine in which fuel is to be injected at a predetermined time instant in relation to an operating parameter of the engine, particularly for a Diesel engine, having
a fuel injection pump (2, 11, 17, 20, 25, 26);
and means controlling the quantity of injected fuel including
a piezoelectric hydraulic control unit (59) comprising
a housing (69)
a spool valve having a spool cylinder (72) and a valve spool (74) slidable in the cylinder;

said valve spool having a section (75) of reduced diameter;

a drain connection (73);

duct means (71) terminating in said spool valve cylinder (72) for selective communication of a pressure inlet (71) with the drain line or blocking said communication in dependence on the position of the spool;

and further comprising a plurality of piezoelectric bending positioning elements (76) coupled to said valve spool (74).

28. System according to claim 27, wherein the fuel injection pump comprises a distributor injection pump having an injection pressure generating portion (15, 16, 17); means (27, 28) for distributing fuel under injection pressure to respective cylinders of th engine; and wherein the fuel quantity control element comprises means for timing occurrence of drainage of fuel at injection pressure to accurately determine the time of build-up of injection pressure and termination of injection pressure of fuel being delivered by the distributor means.

29. System according to claim 28, wherein the distributor means comprises a rotating distributor element (7);

a plurality of distribution passages (28) connectable to respective cylinders of the engine;

a distribution duct (27) in the rotating element, respectively alignable with the distribution passages upon rotation thereof, said distribution passages and distribution ducts forming part of said distributing means;

pressure relief duct means (30, 31, 32; 42, 38, 44, 45, 46; 71, 72, 73) being connected in fluid communication with said distributing means;

and wherein the piezo-electric hydraulic control unit is connected in the pressure relief duct means for controlling drainage of fuel.

30. System according to claim 27, further including an electronic control unit (89) having means to receive a plurality of signals representative of operating or operation parameters of the engine including at least one of: engine speed; loading; air charging temperature; cooling water temperature; lubrication oil temperature; fuel pipe and energy content; ambient air pressure; air charging pressure;

said control unit (89) furnishing control signals determining the injection instant with respect to a piston position in a cylinder of the engine and the termination of injection by providing an output pulse (ON/OFF) to the piezoelectric hydraulic control unit.

* * * * *